June 2, 1970 P. T. ROBINSON 3,515,952

MOUNTING STRUCTURE FOR HIGH POWER TRANSISTORS

Filed Feb. 17, 1965

INVENTOR.
Peter T. Robinson

BY
Mueller and Aichele

ATT'YS.

United States Patent Office 3,515,952
Patented June 2, 1970

3,515,952
MOUNTING STRUCTURE FOR HIGH POWER TRANSISTORS

Peter T. Robinson, Scottsdale, Ariz., assignor to Motorola, Inc., Franklin Park, Ill., a corporation of Illinois Filed Feb. 17, 1965, Ser. No. 433,422
Int. Cl. H01l *1/12, 1/14*
U.S. Cl. 317—234 10 Claims

ABSTRACT OF THE DISCLOSURE

A mounting structure for high power transistors to be operated in the VHF–UHF region. The major portion of the mounting structure is used as a low impedance path for making electrical connection to the emitter region of the transistor, and also as a highly conductive thermal path for removing heat from the collector region. A thin spacer element consisting of a thermally conductive and electrically non-conductive material such as beryllia or alumina, for example, is positioned between the major mounting structure and the collector electrode.

This invention relates to transistor mounting structures and in particular to transistor mounting structures suitable for use within a high frequency high power transistor.

Transistors used in the VHF–UHF frequency range are commonly fabricated with a structure wherein the collector region of the transistor forms the major portion of the transistor. The base region and the emitter region are comparatively small and are formed within the top surface of the collector portion. To remove the heat generated in the transistor, a thermal path of high conductivity is provided from the transistor to an external heat sink. This thermal path includes the major portions of the mounting structure containing the transistor and, since the collector is the major heat generating portion of the transistor, the collector is thermally and electrically connected to this path.

In transistor amplifier circuits is is important that the impedance of the common electrode be minimized in order to prevent degeneration and the attending loss of gain in the amplifying stage. The most commonly used amplifier circuit is the common emitted configuration which requires that the impedance of the emitter be made as small as possible. For transistors operating in the VHF–UHF region, the reactance of the electrode leads is appreciable and is sufficient to cause degeneration and loss of gain in an amplifying stage. In order to minimize this degeneration, it is necessary that the emitter electrode be made very large and form a major portion of the mounting structure. Thus, the emitter electrode requirements are in conflict with the heat removal requirements particularly in the case of a high power transistor.

It may be desired to operate an amplifier in the common base configuration, and in such case it would be necessary that the base electrode form the major portion of the mounting structure.

It is, therefore, an object of this invention to provide an improved transistor mounting structure for use with transistors operating in the VHF–UHF frequency range.

Another object of this invention is to provide a mounting structure for transistors operating as an amplifier in the VHF–UHF frequency range in which the impedance of the common electrode is as small as possible.

Another object of this invention is to provide a mounting structure for transistors operating in the VHF–UHF frequency range, wherein means are provided for removing heat generated in the transistor.

A feature of this invention is the provision of a mounting structure for a high power transistor operating as an amplifier in the VHF–UHF frequency range in which the common region of the transistor is electrically connected to the major portion of the mounting structure to provide a low impedance lead for the common region.

Another feature of this invention is the provision of a mounting structure for a high power transistor operating in the VHF–UHF frequency range in which the collector region of the transistor is thermally connected to the major portion of the mounting structure and electrically insulated therefrom.

Another feature of this invention is the provision of a mounting structure for a high power transistor operating in the VHF–UHF frequency range in which the collector region of the transistor is thermally connected to the major portion of the mounting structure and the emitter region is electrically connected to the major portion of the mounting structure.

The invention is illustrated in the drawings wherein.

Figures 1, 2, 3, 4, 5, 6, 7, 8, 9:
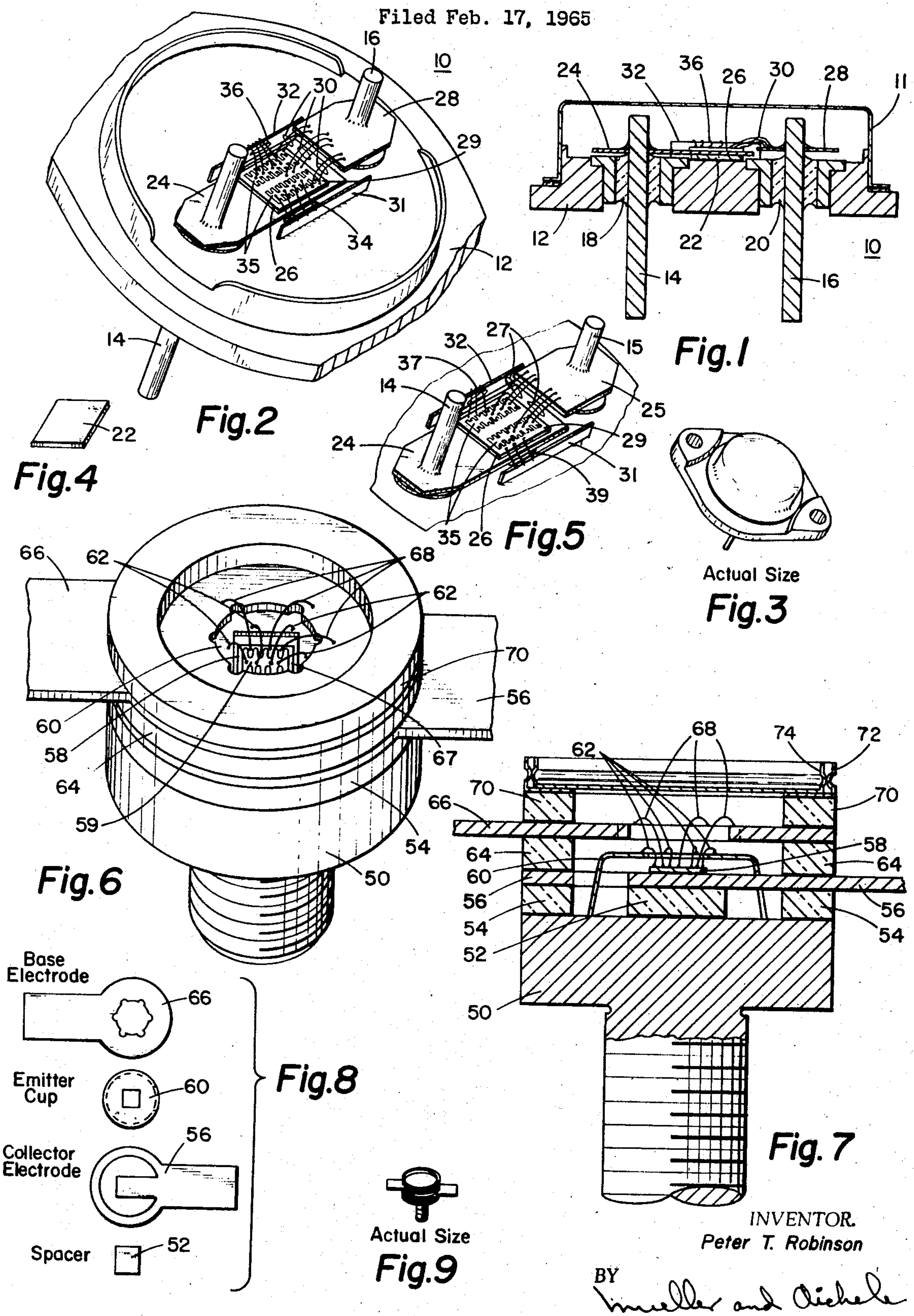
FIG. 1 is a cross-sectional view of a transistor incorporating the mounting structure of this invention.
FIG. 2 is a perspective view of the transistor of FIG. 1.
FIG. 3 shows the actual size of the transistor package of FIGS. 1 and 2.
FIG. 4 illustrates the shape of the spacer used in the embodiment of FIGS. 1 and 2.
FIG. 5 is another embodiment of the structure of FIG. 2 in which the base region of the semiconductor die is connected to the major mounting structure.
FIG. 6 is a second embodiment of a mounting structure incorporating the features of this invention.
FIG. 7 is a cross-sectional view of the structure of FIG. 4.
FIG. 8 illustrates portions of the structure of FIGS. 6 and 7.
FIG. 9 shows the actual size of the transistor package of FIGS. 6 and 7.

In practicing this invention a transistor package is provided for mounting a semiconductor die constructed to be used as a high frequency, high power transistor. The major portion of the mounting structure is used as a low impedance path for making electrical connection to the emitter region of the semiconductor die and also as a highly conductive thermal path for removing heat from the collector region.

In this mounting structure a spacer, having good thermal conductivity properties and good electrical insulating properties, is positioned on the major portion of the mounting structure. A collector electrode is positioned on the spacer and the semiconductor die is positioned on the collector electrode with the collector region of the semiconductor die electrically and thermally connected to the collector electrode. The spacer thus provides a highly conductive thermal path to the major portion of the mounting structure for conducting away heat generated by the transistor.

The emitter region of the transistor is electrically connected directly to the major portion of the mounting structure by an emitter electrode. The emitter electrode is as short as possible and has a large surface area to minimize the reactance thereof. The connection from the major portion of the mounting structure of the emitter region can be made by a plurality of wires to minimize the impedance of this connection. An electrode is also connected to the base region. If it is desired to use the transistor as a common base amplifier the connection between the emitter and base regions can be reversed thus electrically connecting the major mounting structure to the base electrode.

A cross-sectional view of a transistor incorporating the features of this invention is shown in FIG. 1 and a perspective view thereof is shown in FIG. 2. The mounting structure can be in the form of a T0–3 diamond package 10 or any other convenient transistor package. FIGS. 1 and 2 are shown greatly enlarged and the actual size of transistor package 10 is shown in FIG. 3. Package 10 includes a major mounting structure 12 to which the other parts of the package are mechanically fastened. Leads 14 and 16 extend through insulating bushings 18 and 20 in the major mounting structure 12 to provide leads for electrically connecting two separate regions of the transistor semiconductor die with external circuitry. In this type of transistor package the connection to a third transistor region is normally made through the major mounting structure 12. A cover 11 is used to seal the transistor package and permit control over the transistor environment.

The collector region of the transistor is the largest generator of heat and is normally electrically and thermally connected to the major mounting structure 12. The heat generated in the collector region is conducted away from the transistor die through the major mounting structure which has a low thermal resistance. The base and emitter regions are then connected to the leads 14 and 16. If this type of mounting structure is used for a transistor amplifier, having a common emitter configuration and used in the VHF–UHF frequency range, the resulting reactance of the common emitter electrode will cause degeneration thereby reducing the gain of the amplifier. For amplifiers of this type it is desirable to use the large area of the major mounting structure as the emitter electrode to minimize the reactance of the common electrode and thus the degeneration caused thereby. However, the collector must be thermally connected to the large area mounting structure so that heat can be removed rapidly enough to prevent damage to the transistor.

FIGS. 1 and 2 illustrate a transistor package used for a transistor operating in the VHF–UHF region as a common emitter amplifier. The power handled by the transistors may range from 1 watt to 100 watts. This power range is given by way of example and the structure is not necessarily limited to transistors operating in this range.

In the mounting structure of this invention the collector region of the semiconductor die is not electrically connected to the major mounting structure 12 but is separated therefrom by a spacer 22 and a collector electrode 24. Spacer 22 has high thermal conductivity and good electrical insulating qualities and is positioned on the major mounting structure 12 of the transistor package 10. Spacer 22 is shown in FIG. 4. In this example spacer 22 is rectangular in shape but it may be any shape necessary to separate the collector electrode 24 from the major mounting structure 12. Examples of materials which may be used for spacer 22 are beryllia (BeO) and alumina ($Al_2O_3$). The electrical and thermal properties of these materials, together with that of copper, is shown in Table I. It can be seen that the spaced materials beryllia and alumina have good thermal conductivity while also having good electrical insulating properties. The spacer material is not restricted to beryllia or alumina but any material having these properties can be used.

TABLE I

| Material | Thermal Conductivity, cal./sec., ° C. | Electrical Resistivity, ohm-cm. |
|---|---|---|
| Beryllia | .30 | $10^{15}$ |
| Alumina | .04 | $10^{15}$ |
| Copper | .91 | $1.7 \cdot 10^{-6}$ |

A metal collector electrode 24, which may be of copper is soldered to lead 14 and to the top of spacer 22. Semiconductor die 26 is positioned on collector electrode 24 with the collector region of semiconductor die 26 soldered to collector electrode 24. Thus the collector region is thermally connected to the major mounting structure 12 through spacer 22 and collector electrode 24. The collector region of transistor die 26 is also electrically and thermally connected to lead 14. Lead 14 provides an electrical connection from the collector region of semiconductor die 26 to external circuitry and also provides a thermal path for eliminating a portion of the heat generated by the collector region of the transistor.

In presently constructed high power transistors for use in VHF–UHF region, where the collector is electrically and thermally connected to the major mounting structure of the transistor package, electrical insulation of the collector must be accomplished by means external to the transistor package. This external insulation includes an insulator having a relatively large thickness, which must have a large area to permit sufficient heat flow to keep the transistor at safe operating temperature. Spacer 22 has a small area but is relatively thin so that its thermal conductivity is equivalent to the thermal conductivity of the external insulator. Thus the structure of this invention provides the required heat removal capabilities in a much smaller space.

The use of insulating spacer 22 in this manner introduces capacitance between the collector electrode and the emitter. This capacitance is a function of the thickness of the spacer and the area of the spacer. However, spacer 22, having a small area and being relatively thin, provides no more capacitance than the use of the relatively thick large area insulator external to the transistor package. Thus, there is no degradation in transistor performance because of spacer 22.

Referring again to FIGS. 1 and 2, a base electrode 28 is soldered to lead 16 to provide means for connecting external circuitry to the transistor base. A connection from base electrode 28 to the base region 29 of semiconductor die 26 is made by a plurality of wires 30. By using a plurality of wires in this manner the current density and inductance of each wire is reduced, reducing the electrode reactance of the base electrode. It is not necessary to make the connection by a plurality of wires. Other connection means having a large surface area, such as a ribbon, can be used.

A pair of relatively heavy metal bars 31 and 32 are connected to the major mounting structure 12 of the transistor package. A connection is made from bars 31 and 32 to the emitter region 35 of semiconductor die 26 by a plurality of wires 34 and 36. The use of bars 31 and 32 for connecting the wires to the major mounting structure 12 of transistor package permits the plurality of leads 34 and 36 be made as short as possible. As with the base connection, a ribbon can be used in place of the plurality of wires. Again the use of a plurality of short wires minimizes the inductance of the leads thereby reducing the electrode reactance of the emitter electrode. The use of the large mounting structure of the transistor as an emitter electrode reduces the emitter impedance to a very low value compared with prior art mounting structures thus increasing the gain of the transistor amplifier.

FIG. 5 illustrates another embodiment of the structure of FIG. 2. The emitter region 35 of semiconductor die 26 is connetced to electrode 25 by a plurality of wires 27. Electrode 25 is connected to lead 15 so that the emitter region 35 can be connected to external circuitry. The plurality of wires 37 and 39 connect the base region 29 to bars 31 and 32 and thus to mounting structure 12. In the embodiment of FIG. 5 the impedance of the electrode connected to base region 29 is minimized so that the transistor is suitable for use as a common base amplifier.

FIGS. 6, 7 and 8 illustrate another embodiment of a transistor package incorporating the features of this invention. In this embodiment a mounting structure 50 having threads thereon for mechanically mounting the transistor is provided. A spacer 52 is positioned on the copper stud 50. Spacer 52 is similar to spacer 22 of the first embodiment and has the property of having good thermal conductivity with good electrical insulating properties. A ceramic ring 54, having substantially the same thickness as spacer 52, is also positioned on copper stud 50. A connector lead 56 is mechanically bonded to spacer 52 and ceramic ring 54. A semiconductor die 58 is positioned on connector lead 56 so that the collector region of the semiconductor die is bonded to collector lead 56. Thus the collector region of semiconductor die 58 is electrically connected to connector lead 56 and thermally connected to mounting stud 50 through collector lead 56 and spacer 52.

A metal cup 60 is positioned on copper stud 50 and bonded thereto. Cup 60 extends above and substantially surrounds semiconductor die 58. A plurality of short wires 62 are connected from the emitter region 59 of die 58 to cup 60. Thus a low impedance electrical connection is made to external circuitry through the plurality of wires 62, cup 60 and mounting structure 50.

A second spacer ring 64 is positioned on collector lead 56 and a base electrode 66 is positioned on second ceramic ring 64. Base electrode 66 extends over semiconductor die 58 and a plurality of wires 68 connect the base electrode 66 to the base region 67 of semiconductor die 58 through an opening in cup 60. A third ceramic ring 70 is positioned on base electrode 66. A cap retainer 72 and cap 74 provide means for sealing the transistor so that the internal environment can be accurately controlled.

In another embodiment of this device the emitter region 59 of semiconductor die 58 can be connected to electrode 66 and the base region 67 can be connected to cup 60. In this embodiment the impedance of the electrode connected to base region 59 is minimized so that the transistor is suitable for use as a common base amplifier.

Thus, a mounting structure for a high power transistor, operating as an amplifier in the VHF–UHF frequency range, has been shown. The impedance of the common electrode has been reduced permitting an increase in gain of up to 1.8 db over a transistor using a conventional mounting structure. There is no degradation in performance due to increased capacitance or decreased heat removal capability.

What is claimed is:

1. A packaged transistor assembly including in combination a thermally and electrically conductive major mounting structure, a thermally conductive and electrically non-conductive spacer positioned on said mounting structure, a thermally and electrically conductive collector electrode positioned on said spacer and electrically insulated from said mounting structure, a transistor die having a collector region electrically and thermally connected to said collector electrode, said transistor being designed for operation in the VHF–UHF range, and having small area base and emitter contacts located on the opposite side thereof with respect to said collector region, low impedance means electrically connecting one of said base and emitter contact areas to said mounting structure, and electrical connection means attached to the other of said base and emitter contact areas and electrically insulated from said mounting structure.

2. A transistor assembly as defined by claim 1 wherein said low impedance means provides electrical connection between said emitter contact area and said mounting structure.

3. A transistor assembly as defined by claim 1 wherein said low impedance means provides electrical connection between said base contact area and said mounting structure.

4. A transistor assembly as defined by claim 1 wherein said low impedance means comprises a plurality of wires.

5. A high frequency, high power transistor package including in combination, a thermally and electrically conductive mounting structure forming a major portion of said transistor package, first and second connecting leads extending through said mounting structure and electrically insulated therefrom, a thin Beryllia (BeO) spacer positioned on said mounting structure, a thermally and electrically conductive collector electrode positioned on said spacer and connected to said first connecting lead, said collector electrode being electrically insulated from said mounting structure, a semiconductor die having collector, base and parallel elongated emitter regions positioned on said collector electrode with said collector region being electrically and thermally connected to said collector electrode and thermally connected to said spacer and said mounting structure, base electrode means coupled to said second connecting lead, a first plurality of wire leads connecting said base electrode means to said base region, emitter electrode means including a pair of metal bars positioned on opposite sides of said semiconductor die and being parallel to said elongated emitter regions, said bars being connected to said mounting structure and having a second plurality of wire leads coupling said emitter region to said bars to provide a low impedance electrical connection between said emitter region and said mounting structure, and cover means connected to said mounting structure and cooperating therewith to hermetically enclose said semiconductor die.

6. A high frequency, high power transistor package including in combination, a thermally and electrically conductive mounting structure forming a major portion of said transistor package, first and second connecting leads extending through said mounting structure and electrically insulated therefrom, a thin Beryllia (BeO) spacer positioned on said mounting structure, a thermally and electrically conductive collector electrode positioned on said spacer and connected to said first connecting lead, said collector electrode being electrically insulated from said mounting structure, a semiconductor die having collector, emitter and base regions positioned on said collector electrode with said collector region being electrically and thermally connected to said collector electrode and thermally connected to said spacer and said mounting structure, emitter electrode means coupled to said second connecting lead, a first plurality of wire leads connecting said emitter electrode means to said emitter region, base electrode means including a second plurality of wire leads coupling said base region to said mounting structure, said base electrode means being constructed to provide low electrical impedance between said base region and said mounting structure, and cover means connected to said mounting structure and cooperating therewith to hermetically enclose said semiconductor die.

7. A high frequency, high power transistor package including in combination, a thermally and electrically conductive mounting structure forming a major portion of said transistor package, a spacer positioned on said mounting structure, a first ceramic ring positioned on said mounting structure and surrounding said spacer, a thermally and electrically conductive collector electrode mounted on said spacer and said first ring and being electrically insulated from said mounting structure, a semiconductor die having a collector region and first and second other regions, said semiconductor die being positioned on said collector electrode with said collector region being electrically and thermally connected to said collector electrode and thermally connected to said spacer and said mounting structure, a second ceramic ring positioned on said collector electrode, first electrode means positioned on said second ring and including a first plurality of wire leads coupled to said first region, second electrode means including a metal cup surrounding said semiconductor die and being bonded to said mounting structure, a second plurality of wire leads coupling said second region to said cup, said second electrode means being constructed to provide low electrical impedance between said emitter region and said mounting structure, a third ceramic ring positioned on said base electrode, and power means positioned on said third ceramic ring to hermetically enclose said semiconductor die.

8. A high frequency, high power transistor package, including in combination, a thermally and electrically conductive mounting structure forming a major portion of said transistor package, a spacer positioned on said mounting structure, a first ceramic ring positioned on said mounting structure and surrounding said spacer, a thermally and electrically conductive collector electrode mounted on said spacer and said first ring and being electrically insulated from said mounting structure, a semiconductor die having collector, emitter and base regions, said semiconductor die being positioned on said collector electrode with said collector region being electrically and thermally connected to said collector electrode and thermally connected to said spacer and said mounting structure, a second ceramic ring positioned on said collector electrode, base electrode means positioned on said second ring and including a first plurality of wire leads coupled to said base region, emitter electrode means including a metal cup surrounding said semiconductor die and being bonded to said mounting structure, a second plurality of wire leads coupling said emitter region to said cup, said second electrode means being constructed to provide low electrical impedance between said emitter region and said mounting structure, a third ceramic ring positioned on said base electrode, and cover means positioned on said third ceramic ring to hermetically enclose said semiconductor die.

9. A high frequency high power transistor package including in combination, a thermally and electrically conductive mounting structure forming a major portion of said transistor package, first and second connecting leads extending through said mounting structure and electrically insulated therefrom, a thin Beryllia (BeO) spacer positioned on said mounting structure, a thermally and electrically conductive collector electrode positioned on said spacer and connected to said first connecting lead, said collector electrode being electrically insulated from said mounting structure, a semiconductor die having collector, base and emitter regions positioned on said collector electrode with said collector region being electrically and thermally connected to said collector electrode and thermally connected to said spacer and said mounting structure, base electrode means coupled to said second connecting lead, a wire lead connecting said base electrode means to said base region, emitter electrode means including a pair of metal bars positioned on opposite sides of said semiconductor die, said bars being connected to said mounting structure and having a plurality of wire leads coupling said emitter region to said bars to provide a low impedance electrical connection between said emitter region and said mounting structure, and cover means connected to said mounting structure and cooperating therewith to hermetically enclose said semiconductor die.

10. A high frequency high power transistor package including, in combination, a thermally and electrically conductive mounting structure forming a major portion of said transistor package, first and second connecting leads extending through said mounting structure and electrically insulated therefrom, a thin Beryllia (BeO) spacer positioned on said mounting structure, a thermally and electrically conductive collector electrode positioned on said spacer and connected to said first connecting lead, said collector electrode being electrically insulated from said mounting structure, a semiconductor die having collector, base and emitter regions positioned on said collector electrode with said collector region being electrically and thermally connected to said collector electrode and thermally connected to said spacer and said mounting structure, base electrode means coupled to said second connecting lead, an electrical lead connecting said base electrode means to said base region, emitter electrode means positioned on opposite sides of said semiconductor die, said emitter electrode means being connected to said mounting structure and having low impedance electrical leads coupling said emitter region to said emitter electrode means, and cover means connected to said mounting structure and cooperating therewith to hermetically enclose said semiconductor die.

References Cited

UNITED STATES PATENTS

| | | | |
|---|---|---|---|
| 2,887,628 | 5/1959 | Zierdt | 317—234.1 |
| 3,020,454 | 2/1962 | Dixon | 317—234.1 |
| 3,021,461 | 2/1962 | Oakes et al. | 317—234.5 |
| 3,025,437 | 3/1962 | Van Namen et al. | 317—234.1 |
| 3,058,041 | 10/1962 | Happ | 317—234.1 |
| 3,257,588 | 6/1966 | Mueller | 317—234.4 |
| 3,274,667 | 9/1966 | Siebertz | 317—234.5 |
| 3,290,564 | 12/1966 | Wolff | 317—234.1 |
| 3,187,240 | 6/1965 | Clark | 317—234 |
| 3,195,026 | 7/1965 | Wegner et al. | 317—234 |
| 3,225,261 | 12/1965 | Wolf | 317—101 |
| 3,259,814 | 7/1966 | Green | 317—234 |
| 3,310,717 | 3/1967 | Hargasser et al. | 317—235 |

FOREIGN PATENTS

| | | |
|---|---|---|
| 941,760 | 11/1963 | Great Britain. |
| 956,774 | 4/1964 | Great Britain. |
| 1,311,477 | 10/1962 | France. |

JOHN W. HUCKERT, Primary Examiner

R. F. POLISSACK, Assistant Examiner

U.S. Cl. X.R.

317—235